United States Patent
Chen et al.

(10) Patent No.: US 6,259,853 B1
(45) Date of Patent: Jul. 10, 2001

(54) OPTICAL ELEMENT HAVING ELECTRICALLY CONTROLLABLE REFRACTIVE INDEX

(75) Inventors: Yong Chen, Palo Alto; Scott W. Corzine, Sunnyvale; Shih-Yuan Wang, Palo Alto, all of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/389,917

(22) Filed: Sep. 3, 1999

(51) Int. Cl.[7] .................................................. G02B 6/00
(52) U.S. Cl. .......................................... 385/141; 385/131
(58) Field of Search ..................................... 385/141, 131, 385/15, 16

(56) References Cited

U.S. PATENT DOCUMENTS 3,647,406 * 3/1972 Fisher .................................... 385/141
5,235,659 * 8/1993 Atkins et al. ......................... 385/141

* cited by examiner

Primary Examiner—Huy Mai

(57) ABSTRACT

An optical element having a variable index of refraction. The optical element utilizes a layer of a transparent dielectric material having an index of refraction determined by the concentration of hydrogen in the dielectric material. A layer of a hydrogen reservoir medium that includes a material that acts as a source or a sink for hydrogen is placed adjacent to the transparent dielectric layer. The reservoir medium accepts hydrogen from the transparent layer in response to a first electric field being applied across the transparent layer and reservoir layer and donates hydrogen to the transparent layer in response to a second electric field being applied across the transparent layer and the reservoir layer. The electric fields are generated by applying appropriate potentials across first and second electrodes that sandwich the dielectric and reservoir layers. The preferred reservoir material is KOH. The transparent dielectric material preferably includes a material chosen from the group consisting of hydrides of an alkali, alkaline-earth, rare-earth metals, and alloys thereof.

4 Claims, 1 Drawing Sheet

OPTICAL ELEMENT HAVING ELECTRICALLY CONTROLLABLE REFRACTIVE INDEX

FIELD OF THE INVENTION

The present invention relates to optical devices, and more particularly, to optical devices having a refractive index that is electrically controllable.

BACKGROUND OF THE INVENTION

Numerous optical devices utilize elements whose index of refraction is altered in response to a control signal. For example switching elements based on total internal reflection (TIR) switching elements are well known in the optical arts. A TIR element consists of a waveguide with a switchable boundary. Light strikes the boundary at an angle. In the first state, the boundary separates two regions having substantially different indices of refraction. In this state the light is reflected off of the boundary and thus changes direction. In the second state, the two regions separated by the boundary have the same index of refraction and the light continues in a straight line through the boundary. The magnitude of the change of direction depends on the difference in the index of refraction of the two regions. To obtain a large change in direction the region behind the boundary must be switchable between an index of refraction equal to that of the waveguide and an index of refraction that differs markedly from that of the waveguide.

Prior art TIR elements that provide a large change in index of refraction independent of the polarization of the light signal operate by mechanically changing the material behind the boundary, and hence, have relatively slow switching speeds. TIRs based on liquid crystals have higher switching speeds and provide relatively large changes in the index of refraction. However, these devices require the light signal to be polarized, and hence, half of the light intensity must be sacrificed or two devices must be utilized, one operating on each polarization state.

Prior art TIR elements with very fast switching times are also known. These elements alter the index of refraction of the material behind the boundary by applying an electric field to a material whose index of refraction is a function of the electric field. For example, U.S. Pat. No. 5,078,478 describes a TIR element in which the waveguide is constructed in a ferroelectric material. The index of refraction of the ferroelectric material along a boundary within the waveguide is altered by applying an electric field across a portion of the waveguide. While this type of device switches in nanoseconds, the change in index of refraction is very small, and hence, the direction of the light can only be altered by a few degrees. Deflections of this magnitude complicate the design of devices based on TIRs such as cross-point arrays, and hence, commercially viable cross-connects based on this technology have not been forthcoming.

In addition to their use in switching elements, devices that have an electrically controllable index of refraction can also be used to provide optical delay lines and other devices that depend on the transit time of the light. For example, delay lines can be inserted into laser cavities to provide a means for tuning the output wavelength of the laser. Tunable optical filters may also be constructed from such devices. Unfortunately, the problems discussed above with respect to TIRs also inhibit the realization of these applications using prior art optical elements whose index of refraction may be controlled electrically.

Broadly, it is the object of the present invention to provide an improved optical element whose index of refraction can be tuned electrically.

It is a further object of the present invention to provide an optical element having an index of refraction that can be tuned over a larger range than prior art devices without requiring the light signals processed thereby to be polarized.

It is a still further object of the present invention to provide an optical element whose index of refraction can be altered in a shorter time than prior art devices based on mechanical alteration of a portion of a waveguide while providing larger changes of index of refraction than obtainable from ferroelectric and like materials.

These and other objects of the present invention will become apparent to those skilled in the art from the following detailed description of the invention and the accompanying drawings.

SUMMARY OF THE INVENTION

The present invention is an optical element having a variable index of refraction. The optical element utilizes a layer of a transparent dielectric material having an index of refraction determined by the concentration of hydrogen m the dielectric material. A layer of a hydrogen reservoir medium that includes a material that acts as a source or a sink for hydrogen is placed adjacent to the transparent dielectric layer. The reservoir medium accepts hydrogen from the transparent layer in response to a first electric field being applied across the transparent layer and the reservoir layer and donates hydrogen to the transparent layer in response to a second electric field being applied across the transparent layer and the reservoir layer. The electric fields are generated by first and second electrodes that sandwich the dielectric and reservoir layers. The preferred reservoir material is KOH. The transparent dielectric material preferably includes a material chosen from the group consisting of hydrides of an alkali, alkaline-earth, rare-earth metals, and alloys thereof.

DETAILED DESCRIPTION OF THE INVENTION

Figure 1:
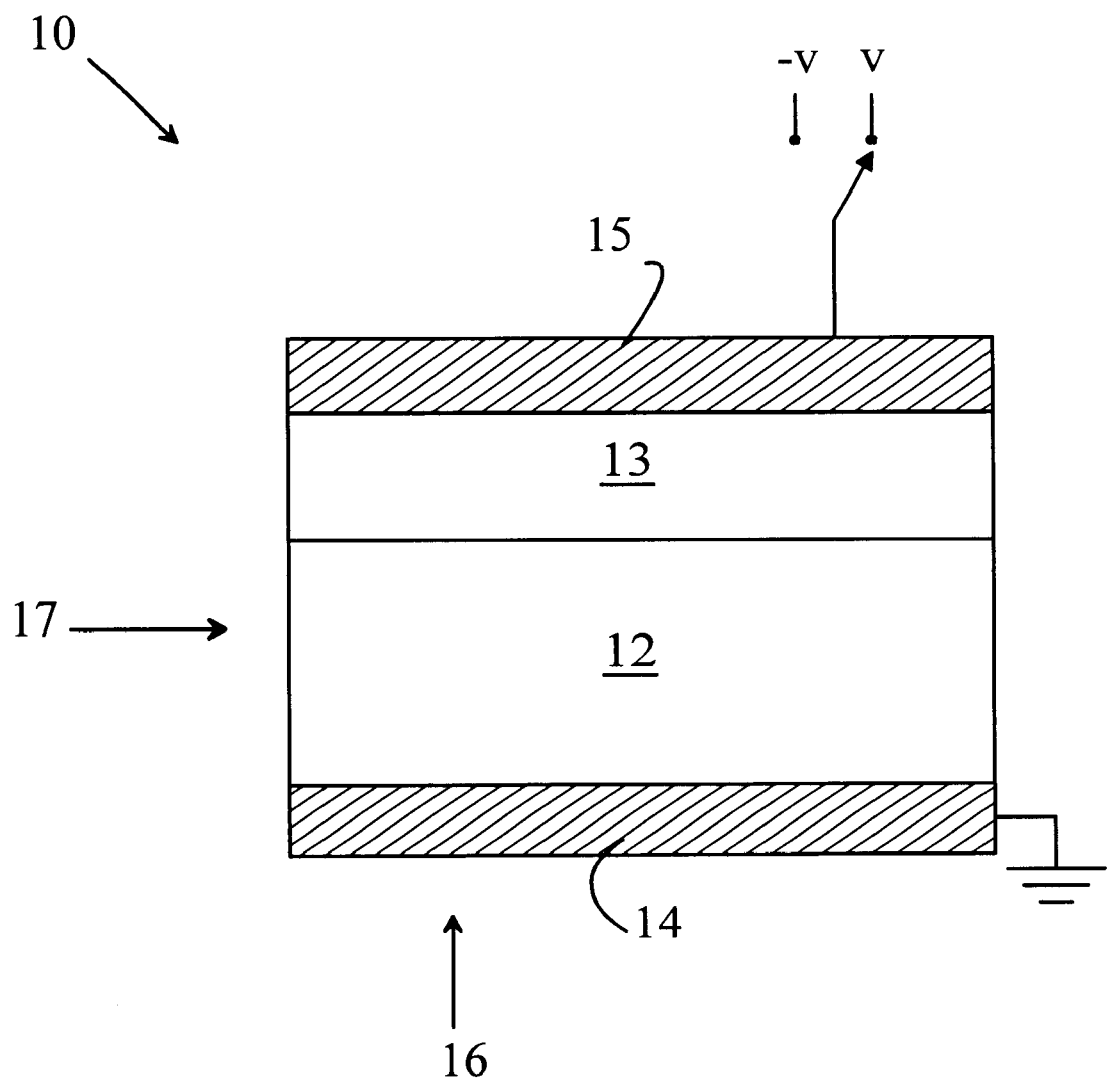
FIG. 1 is a cross-sectional view of an optical element according to the present invention.

The present invention is based on hydrides of an alkali, alkaline-earth, rare-earth metals, and alloys thereof. These metals form hydrides on exposure to hydrogen gas. The hydrides are insulating compounds, which are transparent if the layers are sufficiently thin. In the case of lanthanum and yttrium, the metals can exist in two hydride states, $MH_2$ and $MH_3$. The two hydride states can be easily converted from one to another by altering the hydrogen content. The di-hydride state has a partially filled conduction band, and hence, acts as a mirror. The tri-hydride state is a transparent insulator.

Consider a metal hydride film that starts out in a conducting state and is converted to an insulator by increasing the amount of hydrogen bound by the film. After the film absorbs sufficient hydrogen, it is converted from a metal to a transparent insulator. However, this transition takes place at a hydrogen concentration that is less than the saturation concentration for the metal hydride. Between the metal to insulator transition concentration and the saturation concentration, it is observed experimentally that the index of refraction of the insulator changes with hydrogen concentration. Hence, if the hydrogen concentration can be controlled electrically, an optical element having a controllable index of refraction is obtained. The variation in index of refraction that can be obtained in this region can be greater than 30% of the index of refraction at hydrogen saturation for some metal hydrides such as those based on GdMg alloys.

Refer now to FIG. 1, which is a cross-sectional view of an optical element 10 according to the present invention. Optical element 10 is constructed from a layer 12 of a metal hydride that is in contact with a hydrogen source layer 13. These layers are sandwiched between electrodes 14 and 15. When a potential is applied across the electrodes in one direction, hydrogen moves from the hydrogen source layer 13 into the metal hydride layer thereby increasing the concentration of hydrogen in the metal hydride. When the reverse potential is applied, hydrogen is removed from metal hydride layer 12. With some metal hydrides, a bias potential may be needed to hold the concentration of hydrogen in the hydride at a fixed level.

A number of metal hydrides may be used to construct layer 12. For example, hydrides of lanthanum and yttrium can be utilized. $LaH_2$ changes to $LaH_3$, and $YH_2$ to $YH_3$ upon the addition of hydrogen. In addition, the Mg alloys of such compounds may also be utilized. In the di-hydride state, these compounds are metallic. The tri-hydride state is insulating or semiconducting.

Various hydrogen sources can be used. For example, 5M NaOH or KOH solution can be used in liquid or gel form. In addition, hydrogen impregnated solid sources such as conductors or semiconductors implanted with hydrogen ions may be used to transport hydrogen in or out of the metal/hydride. For example, GaAs implanted with hydrogen ions to a depth of 100 nm and a density of $>10^{15}$ hydrogen ions per $cm^2$ may be utilized both as one of the electrodes and the hydrogen reservoir.

One or both of the electrodes may be transparent in those applications in which light enters metal hydride layer 12 through the electrode as shown at 16. The preferred transparent electrode material is indium tin oxide (ITO).

Light signals to be "processed" by element 10 can enter element 10 through either one of the electrodes as shown at 16. The signals can enter at an angle or parallel to the electrodes as shown at 17. Light passing parallel to the electrodes will be delayed by an amount determined by the hydrogen concentration in metal hydride layer 12. Hence, element 10 can be utilized as a variable delay element for tuning layers.

If electrode 15 is reflective and hydrogen source layer 13 is transparent, light entering the device in direction 16 will be reflected back from electrode 15 in a variable phase shift determined by an amount that depends on the hydrogen concentration in metal hydride layer 12. This variable phase shift may be sensed by measuring the interference between the reflected light and the incident light beam.

This embodiment of the present invention is useful in storing information that can be read-out optically. A logical "1" is stored by pulsing the element with an electric field in one direction, and a "0" is stored by pulsing the element with an electric field in the other direction. The transparency of electrode 14 is adjusted such that electrode 14 is partially reflective in this embodiment. Hence, the light returning from the element will be the sum of the light reflected from electrode 15 and that reflected from electrode 14. In the preferred embodiment of the present invention, the light source is a coherent source such as a laser. The thickness of layers 12 and 13 are chosen such that the light will constructively or destructively add for one logic state but not for the other logic state.

Various modifications to the present invention will become apparent to those skilled in the art from the foregoing description and accompanying drawings. Accordingly, the present invention is to be limited solely by the scope of the following claims.

What is claimed is:

1. An optical element having a variable index of refraction, said optical element comprising:

a layer of a transparent dielectric material having an index of refraction determined by the concentration of hydrogen in said dielectric material;

a layer of a hydrogen reservoir medium comprising a material that acts as a source or a sink for hydrogen, said reservoir medium accepting hydrogen from said layer of transparent dielectric material in response to a first electric field being applied across said layer of transparent dielectric material and said reservoir medium donating hydrogen to said transparent dielectric material in response to a second electric field being applied across said layer of transparent dielectric material and said layer of hydrogen reservoir medium; and a first electrode and a second electrode, said layer of transparent dielectric material and said layer of hydrogen reservoir material lying between said first and second electrodes.

2. The optical element of claim 1 wherein said hydrogen reservoir medium comprises KOH or NaOH.

3. The optical element of claim 1 wherein said hydrogen reservoir medium comprises a solid impregnated with hydrogen.

4. The optical element of claim 1 wherein said transparent dielectric material comprises a material chosen from the group consisting of hydrides of an alkali, alkaline-earth, rare-earth metals, and alloys thereof.

* * * * *